United States Patent
Lee et al.

(10) Patent No.: US 7,399,700 B2
(45) Date of Patent: Jul. 15, 2008

(54) DUAL DAMASCENE INTERCONNECTION WITH METAL-INSULATOR-METAL CAPACITOR AND METHOD OF FABRICATING

(75) Inventors: Kyoung-woo Lee, Seoul (KR); Soo-geun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/897,417

(22) Filed: Aug. 30, 2007

(65) Prior Publication Data

US 2007/0298580 A1    Dec. 27, 2007

Related U.S. Application Data

(62) Division of application No. 10/799,292, filed on Mar. 12, 2004, now Pat. No. 7,279,733.

(30) Foreign Application Priority Data

Apr. 3, 2003    (KR) .................................. 03-21036

(51) Int. Cl.
*H01L 21/4763* (2006.01)

(52) U.S. Cl. ........................ 438/638; 438/253; 438/597; 257/E21.579

(58) Field of Classification Search .................. 438/253, 438/597, 638; 257/E21.579
See application file for complete search history.

(56) References Cited

U.S. PATENT DOCUMENTS

| | | |
|---|---|---|
| 6,483,142 B1 | 11/2002 | Hsue et al. |
| 6,512,260 B2 | 1/2003 | Hsue et al. |
| 6,740,974 B2 | 5/2004 | Yoshitomi |
| 6,746,914 B2 | 6/2004 | Kai et al. |
| 6,750,115 B1 | 6/2004 | Ning et al. |
| 2003/0012117 A1 | 1/2003 | Ogawa et al. |

FOREIGN PATENT DOCUMENTS

KR    2002-0018610    3/2002

*Primary Examiner*—Asok K Sarkar
(74) *Attorney, Agent, or Firm*—Mills & Onello LLP

(57) ABSTRACT

Provided are a dual damascene interconnection with a metal-insulator-metal (MIM) capacitor and a method of fabricating the same. In this structure, an MIM capacitor is formed on a via-level IMD. After the via-level IMD is formed, while an alignment key used for patterning the MIM capacitor is being formed, a via hole is formed to connect a lower electrode of the MIM capacitor and an interconnection disposed under the via-level IMD. Also, an upper electrode of the MIM capacitor is directly connected to an upper metal interconnection during a dual damascene process.

15 Claims, 7 Drawing Sheets

DUAL DAMASCENE INTERCONNECTION WITH METAL-INSULATOR-METAL CAPACITOR AND METHOD OF FABRICATING

CROSS REFERENCES TO RELATED APPLICATIONS

This application is a divisional of U.S. application Ser. No. 10/799,292, filed on Mar. 12, 2004, which claims the priority of Korean Patent Application No. 2003-21036, filed on Apr. 3, 2003, in the Korean Intellectual Property Office, the contents of which are incorporated herein by reference in their entirety by reference.

BACKGROUND OF THE INVENTION

1. Field of the Invention

The present invention relates to a semiconductor device and a method of fabricating the same. More particularly, the present invention relates to a dual damascene interconnection with a metal-insulator-metal (MIM) capacitor and a method of fabricating the same.

2. Description of the Related Art

To improve the speed of semiconductor devices, there have been intensive studies on methods of reducing RC delays using low-resistance interconnections and low-k intermetal dielectrics (IMDs). Copper interconnections have a lower resistance than conventional aluminum interconnections and a relatively high resistance to electromigration, thus improving the reliability of semiconductor devices. Also, copper requires low power consumption and low price and thus has been widely used as interconnection material.

However, since copper is not easily etched, patterning a copper layer in a desired shape is very difficult. Thus, a damascene process is used. That is, after a groove is formed in an interconnection shape by patterning an IMD, copper is filled in the groove and then planarized using chemical mechanical polishing (CMP) to be on the same level with the IMD. In particular, a dual damascene process is widely used in which a via hole is formed and a line trench is formed over the via hole to overlap the via hole, and the via hole and the line trench are simultaneously filled with copper using a one-time deposition. By comparison, a via may be formed using a damascene process and then a line trench may be formed using another damascene process. In this case, the via and the line are each formed using a single damascene process.

Also, extensive studies have been made on metal-insulator-metal (MIM) capacitors, in which electrodes have no depletion and low-resistance metals are used, unlike conventional capacitors having an upper electrode and a lower electrode that are formed of polysilicon. However, when an MIM capacitor is formed in a conventional dual damascene interconnection, a dual damascene process has to be altered and the fabrication process becomes complex.

FIGS. 1 and 2 show conventional structures in which electrodes of an MIM capacitor are connected to interconnections using vias. To form these conventional structures, an MIM capacitor is formed before a via-level IMD is formed and an electrode of the MIM capacitor is connected to an interconnection by a via. However, in this case, as shown in FIGS. 1 and 2, a via that will be formed on the MIM capacitor and a via that will connect upper and lower interconnections are formed to different depths. As a result, a dual damascene process needs an etch process having a very high etch selectivity.

To form the structure shown in FIG. 1, a lower metal interconnection 4 and a lower electrode 6 of an MIM capacitor are formed using a copper damascene process on the same level in an insulating layer 2. A capacitor dielectric layer 8 is coated on the resultant structure, and then an upper electrode 10 and a capping layer 12 are sequentially formed. Next, an IMD 14 is formed, and then a via 16a connected to the lower metal interconnection 4, a via 18a connected to the lower electrode 6, and a via 20a connected to the upper electrode 10 are formed using a dual damascene process. Thereafter, upper metal interconnections 16b, 18b, and 20b are formed on the vias 16a, 18a, and 20a, respectively.

In the structure shown in FIG. 1, the types of available dielectric layers 8 are limited. The dielectric layer 8 should function as both a capacitor dielectric layer and a diffusion barrier layer to copper that is used to form the lower electrode 6. Thus, the dielectric layer 8 is actually a silicon nitride layer. Also, since the lower electrode 6 is polished using chemical mechanical polishing (CMP) during the dual damascene process, its surface morphology is degraded. Thus, the characteristics of the MIM capacitor depend on the integrity of an interface between the lower electrode 6 and the dielectric layer 8. Also, the copper constituting the lower electrode 6 diffuses into the dielectric layer 8. Most seriously, the vias 16a and 18a connecting the upper and lower interconnections are formed to a different depth from that of the via 20a formed on the MIM capacitor. Thus, an etch process having a very high etch selectivity is needed during the dual damascene process. To form the vias 16a and 18a separately from the via 20a because of the etch selectivity, an additional mask is required. Thus, the dual damascene process must be modified.

In FIG. 2, only a lower metal interconnection 24 is formed in the insulating layer 22 using a copper damascene process. A diffusion barrier layer 25 is formed on the insulating layer 22, and a lower electrode 26 of an MIM capacitor is formed using, for example, TaN. Then, a capacitor dielectric layer 28 and an upper electrode 30 are sequentially formed on the resultant structure. A capping layer 32 and an IMD 34 are formed on the upper electrode 30. Thereafter, a via 36a connected to the lower metal interconnection 24, a via 38a connected to the lower electrode 26, and a via 40a connected to the upper electrode 30 are formed using a dual damascene process, and upper metal interconnections 36b, 38b, and 40b are formed on the vias 36a, 38a, and 40a, respectively.

In the structure shown in FIG. 2, since the lower electrode 26 is not formed of copper, the types of material used in the dielectric layer 28 are more numerous compared to the structure of FIG. 1. Thus, the dielectric layer 28 can be formed of even high-k dielectric material. Nevertheless, in this structure, three different-type vias 36a, 38a, and 40a are formed requiring an etch process having a high etch selectivity or an additional photolithographic process. Therefore, the dual damascene process must be modified.

FIG. 3 shows another conventional structure in which an MIM capacitor is connected to an AlCu interconnection. In this structure, lower interconnections 42a and 42b are formed of AlCu, and then an insulating layer 44 is formed. Next, vias 46a, 46b, and 46c are formed of W using a single damascene process, and a lower electrode 48, a dielectric layer 50, and an upper electrode 52 are formed on the vias 46a and 46b to complete an MIM capacitor. Thus, the lower electrode 48 is connected to the lower interconnection 42a by the vias 46a and 46b. Next, a first IMD 54 is formed, an AlCu interconnection 55 is formed using a single damascene process, and a second IMD 56 is deposited thereon. Similarly, through a single damascene process, a W stud 58a connected to the upper electrode 52 and a W stud 58b connected to the AlCu interconnection 55 are formed in the second IMD 56.

In this case, unlike the cases described with reference to FIGS. 1 and 2, problems of an etch process due to different types of vias can be solved. However, since the single damascene process is performed several times, the copper dual damascene process must be somewhat modified. Also, while the MIM capacitor is being fabricated, the via 46c is exposed to an etching atmosphere, thus degrading the yield and reliability of the via 46c. To solve these problems, the vias 46a and 46b formed under the MIM capacitor and the via 46c connecting the upper and lower interconnections 42b and 55 should be formed using separate processes. However, this case necessitates an additional photolithography process.

SUMMARY OF THE INVENTION

The present invention provides a method of fabricating a dual damascene interconnection with an MIM capacitor by forming the MIM capacitor without modifying a dual damascene process and using additional masks.

The present invention also provides a dual damascene interconnection with a reliable MIM capacitor.

In accordance with an aspect of the present invention, there is provided a method of fabricating a dual damascene interconnection with an MIM capacitor, the method comprising forming a via-level IMD on a substrate where first and second lower metal interconnections are formed, and forming a via hole for connecting a lower electrode of an MIM capacitor and the first lower metal interconnection by patterning the via-level IMD. Next, a metal layer for a capacitor lower electrode, a capacitor dielectric layer, and a metal layer for a capacitor upper electrode are sequentially formed on the surface of the substrate. Then, the metal layer for the lower electrode, the capacitor dielectric layer, and the metal layer for the upper electrode, which are disposed over the via hole, are patterned to form the MIM capacitor, which includes a lower electrode, a dielectric layer, and an upper electrode. A trench-level IMD is formed on the via-level IMD including the MIM capacitor, and then the via-level IMD and the trench-level IMD are etched, thereby simultaneously forming a groove for a dual damascene interconnection, exposing the second lower metal interconnection, and a trench exposing the upper electrode. The groove for the dual damascene interconnection and the trench are filled with a metal, thereby forming a dual damascene interconnection connected to the second lower metal interconnection and an upper metal interconnection connected to the upper electrode.

In one embodiment, formation of the first lower metal interconnection and the second metal interconnection comprises: forming an insulating layer on the substrate; and forming the first lower metal interconnection and the second lower metal interconnection by filling the insulating layer with a metal using a damascene process.

The via hole can be formed in a hole shape. The via hole can be formed in a line shape.

In one embodiment, the method further comprises: forming an etch stop layer between the first and second lower metal interconnections and the via-level intermetal dielectric; and forming another etch stop layer between the via-level intermetal dielectric and the trench-level intermetal dielectric.

In one embodiment, the method further comprises forming the metal-insulator-metal capacitor using one masking process and then reducing the area of the upper electrode by etching edges of the upper electrode.

The lower electrode can directly contact the first lower metal interconnection by the via hole.

In one embodiment, the method further comprises, after forming the via hole, further comprising forming a via for connecting the lower electrode and the first lower metal interconnection by filling the via hole with a conductive material and then planarizing the filled conductive material.

The formation of the groove for the dual damascene interconnection can include forming the via hole and the line trench using a via-first dual damascene process. While the line trench is being formed, the trench exposing the upper electrode is formed.

In one embodiment, formation of the groove for the dual damascene interconnection includes forming a via hole and a line trench using a line trench-first dual damascene process.

In one embodiment, the dual damascene interconnection is formed of at least one of copper, gold, silver, tungsten, and any alloy thereof.

In one embodiment, while the via hole for connecting the lower electrode of the metal-insulator-metal capacitor and the first lower metal interconnection is being formed, an alignment key for aligning the metal-insulator-metal capacitor is formed by patterning the via-level intermetal dielectric. The formation of the metal-insulator-metal capacitor includes leaving the metal layer for the lower electrode, the capacitor dielectric layer, and the metal layer for the upper electrode on the inner walls of the alignment key by performing an anisotropic etchback process. While the dual damascene interconnection and the upper metal interconnection are being formed, a dummy interconnection can be formed by filling a stepped region of the alignment key.

In accordance with another aspect of the present invention, there is provided a dual damascene interconnection with an MIM capacitor comprising a via-level IMD and a trench-level IMD which are sequentially stacked on a substrate; a dual damascene interconnection formed in the via-level IMD and the trench-level IMD; and an MIM capacitor formed between the via-level IMD and the trench-level IMD to include a lower electrode, a dielectric layer, and an upper electrode.

In one embodiment, the first lower metal interconnection and the second lower metal interconnection are damascene interconnections buried in an insulating layer formed on the substrate. The via can be filled in a hole-type opening. The via is filled in a line-type opening.

In one embodiment, the lower electrode, the dielectric layer, and the upper electrode are patterned to have the same area.

The upper electrode can be patterned to have a smaller area than that of each of the lower electrode and the capacitor dielectric layer.

The via can be integrally formed with the lower electrode.

In one embodiment, an alignment key is formed in the via-level intermetal dielectric so as to have the step difference to align the metal-insulator-metal capacitor. In one embodiment, the metal layer for the lower electrode, the dielectric layer, and the metal layer for the upper electrode are on the inner walls of the alignment key. The structure further includes a dummy interconnection in a stepped region of the alignment key.

In one embodiment, the dual damascene interconnection is formed of at least one material selected from the group consisting of copper, gold, silver, tungsten, and any alloy thereof.

The via and the dual damascene interconnection can be formed of different materials.

In one embodiment, the structure further comprises: a first lower metal interconnection and a second lower metal interconnection formed between the substrate and the via-level intermetal dielectric; and an upper metal interconnection formed on and connected to the upper electrode. The lower electrode is directly connected to the first lower metal interconnection, and the dual damascene interconnection is connected to the second metal interconnection.

According to the present invention, an MIM capacitor can be fabricated without modifying a dual damascene process and the yield and reliability of the MIM capacitor can be improved.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Embodiment 1

FIGS. 4 through 10 are cross-sectional views illustrating a method of fabricating a dual damascene interconnection with an MIM capacitor according to an embodiment of the present invention. While only copper is used as interconnection material in embodiments of the present invention for clarity of description, other metals, such as aluminum, gold, silver, and tungsten, can be used instead of copper.

Figure 1:
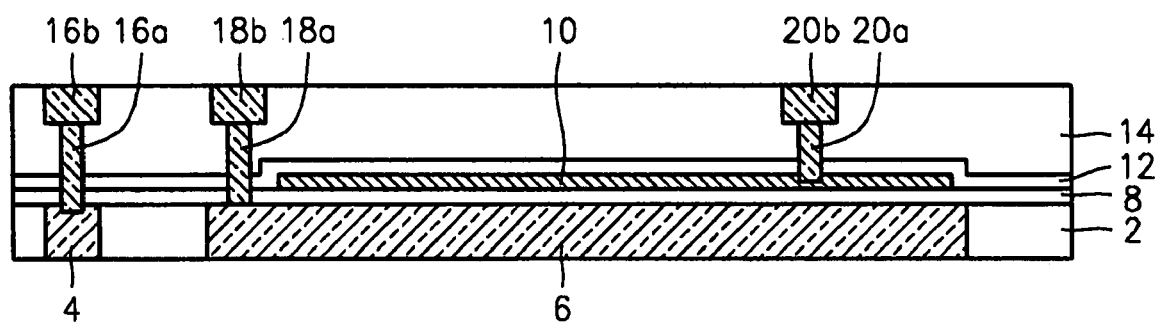
FIGS. 1 and 2 show conventional structures in which electrodes of an MIM capacitor are connected to interconnections using vias.
Figure 2:
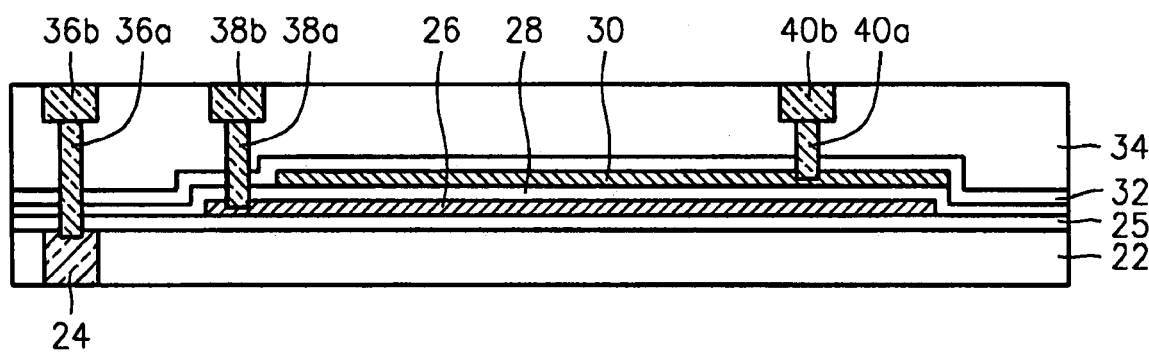
Figure 3:
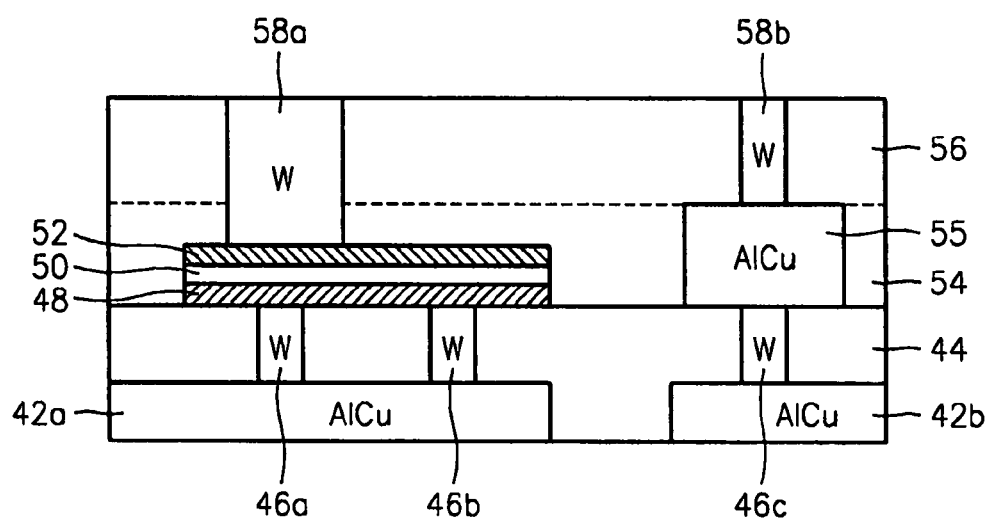
FIG. 3 shows another conventional structure in which an MIM capacitor and an AlCu interconnection are formed.
Figure 4:
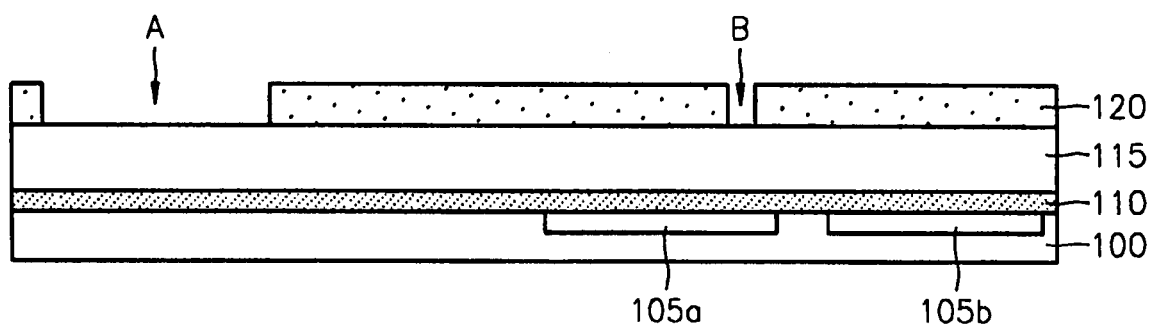
FIGS. 4 through 10 are cross-sectional views illustrating a method of fabricating a dual damascene interconnection with an MIM capacitor according to an embodiment of the present invention.

Referring to FIG. 4, an insulating layer 100 is formed on a substrate (not shown) and then filled with a metal using a damascene process, thereby forming a first lower metal interconnection 105a and a second lower metal interconnection 105b. If the first and second lower metal interconnections 105a and 105b are copper interconnections, a diffusion barrier layer is preferably further formed using sputtering at an interface between the insulating layer 100 and each of the first and second lower metal interconnections 105a and 105b. The diffusion barrier layer, which prevents diffusion and oxidation of copper, may be formed of at least one of Ta, TaN, TaSiN, TiN, TiSiN, WN, and WSiN.

Next, an etch stop layer 110, which also functions as a diffusion barrier layer, is formed by depositing silicon nitride using plasma-enhanced chemical vapor deposition (PECVD), and then a via-level IMD 115 is deposited. The via-level IMD 115 is formed of a low-k dielectric material so as to reduce RC delay. For example, the via-level IMD 115 is formed of black diamond, fluorine silicate glass (FSG), SiOC, polyimide, or SiLK™. Here, the etch stop layer 110 is formed to a thickness of about 500 Å to 1000 Å, for example, 700 Å. Although the via-level IMD 115 is formed to a thickness of about 4000 Å to 8000 Å, preferably 6000 Å, it is possible to adjust the thickness of the via-level IMD 115 depending on whether the via-level IMD 115 is used at a lower end of the resultant structure close to a gate or at an upper end thereof far from the gate.

A photoresist layer 120 is patterned so as to define an opening A, which exposes a region where an alignment key for adjusting the alignment during patterning of a capacitor will be formed, and an opening B, which exposes a region where a via for connecting a lower electrode of the MIM capacitor and the first lower metal interconnection 105a will be formed. Here, while the via-region opening B may be formed as any one of a hole-type and a line-type, it is preferably formed as a line-type given a subsequent process of filling a metal in it. As is known to those skilled in the art, the alignment key refers to an element formed in the via-level IMD 115 so as to have the step difference to facilitate the alignment of patterns during a subsequent photolithography process.

Figure 5:
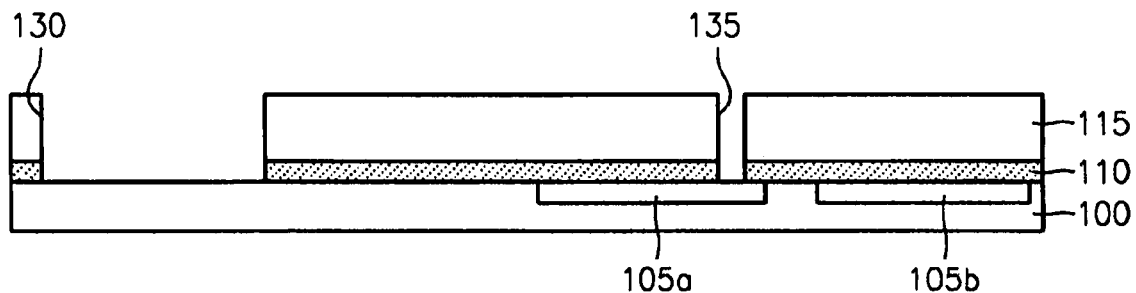

Referring to FIG. 5, the via-level IMD 115 is patterned by an etch process using the photoresist layer 120 as an etch mask, and the etch stop layer 110 disposed under each opening also is removed to expose a contact region. As described above, while the alignment key 130 for aligning the capacitor is being formed, a via hole 135 for connecting the first lower metal interconnection 105a to the lower electrode is formed together. Thereafter, the photoresist layer 120 is removed.

Figure 6:
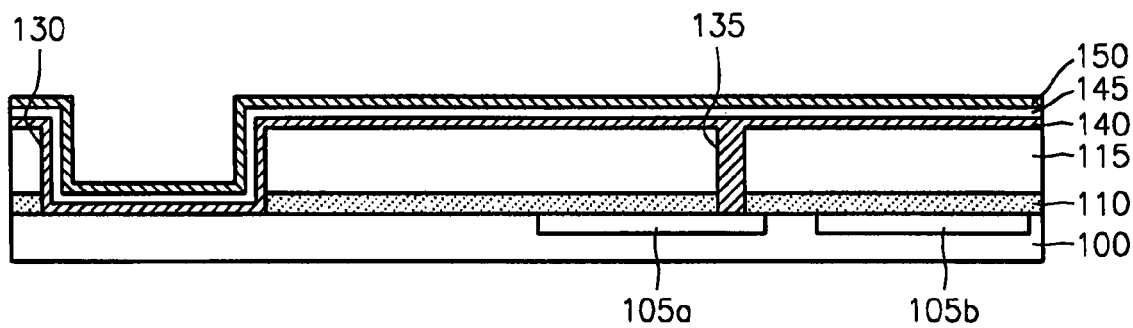

Referring to FIG. 6, a metal layer 140 for a capacitor lower electrode, a capacitor dielectric layer 145, and a metal layer 150 for a capacitor upper electrode are sequentially formed on the entire surface of the via-level IMD 115. Here, the metal layer 140 for the lower electrode is formed so as to fill the via hole 135 such that the lower electrode directly contacts the first lower metal interconnection 105a by the via hole 135. To fill a narrow space in the via hole 135, the metal layer 140 for the lower electrode is formed using CVD. The metal layer 140 for the lower electrode and the metal layer 150 for the upper electrode are formed of, for example, Ta, TaSiN, TiN, TiSiN, WN, or WSiN. The capacitor dielectric layer 145 may be formed of one of silicon nitride, silicon carbide, a combination of silicon nitride and oxide, and a combination of silicon carbide and oxide. Also, the dielectric layer 145 may be formed of hafnium oxide or aluminium oxide, which has a higher dielectric constant than the foregoing dielectric materials.

Figure 7:
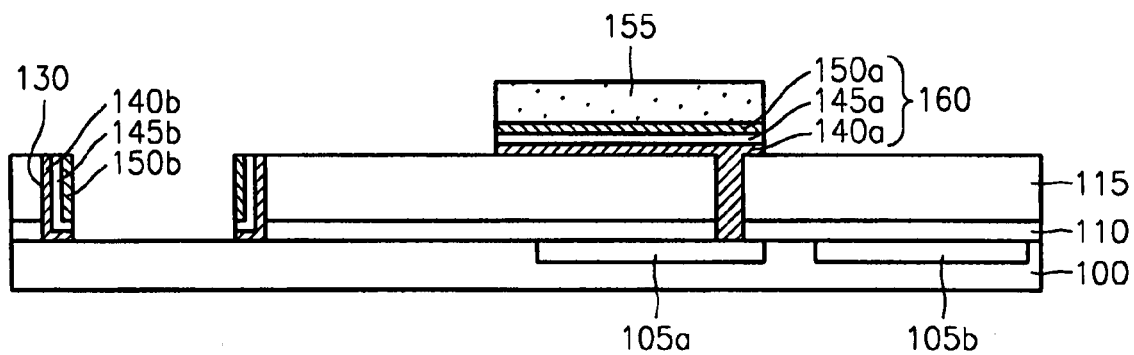

Referring to FIG. 7, to form an MIM capacitor, a photoresist pattern 155 is formed on the metal layer 150 for the upper electrode and the entire surface of the resultant structure is etched back using the photoresist pattern 155 as an etch mask. When the photoresist pattern 155 is formed, the step difference of the alignment key 130 is utilized. Since the metal layer 140 for the lower electrode, the capacitor dielectric layer 145, and the metal layer 150 for the upper electrode are etched and removed, an MIM capacitor 160, which includes a lower electrode 140a, a dielectric layer 145a, and an upper electrode 150a, is formed only under the photoresist pattern 155. A metal layer 140b for the lower electrode, a capacitor dielectric layer 145b, and a metal layer 150b for the upper electrode may remain also on the inner walls of the alignment key 130 (i.e., a stepped region) because of an anisotropic etching characteristic of the etchback process. However, since the remaining layers 140b, 145b, and 150b are not connected to any interconnections, they may not be removed as shown in FIG. 7. Here, vias do not exist in regions other than under the MIM capacitor 160. Thus, when the MIM capacitor 160 is patterned, vias are not damaged.

Figure 8:
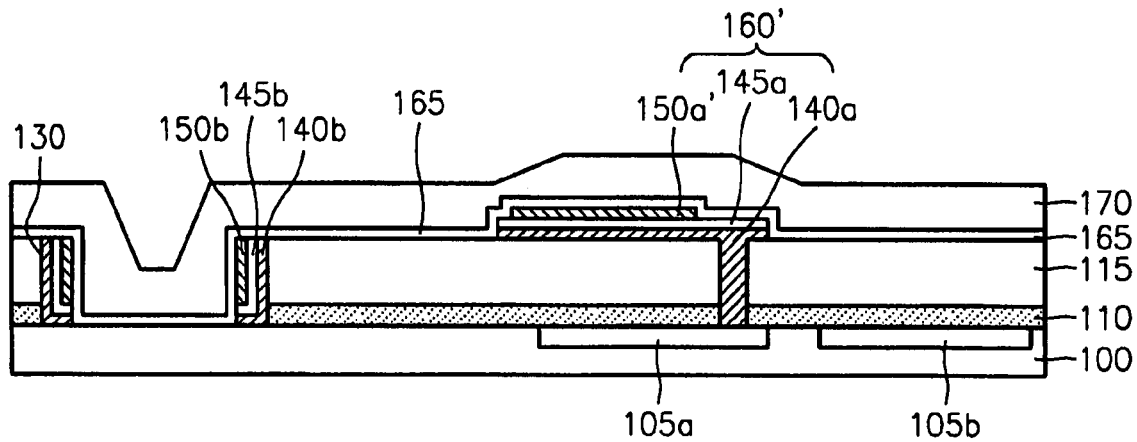

Referring to FIG. 8, after the photoresist pattern 155 is removed, to remove metallic residue that may remain on the sidewalls of the MIM capacitor 160 when the MIM capacitor 160 is patterned, etching edges of the upper electrode 150a to shrink the area of the upper electrode 150a is further performed. As a result, the MIM capacitor 160' includes an upper electrode 150a', the area of which is smaller than that of the lower electrode 140a or the dielectric layer 145a. Thereafter, silicon nitride or silicon carbide is deposited on the MIM capacitor 165', thereby forming an etch stop layer 165 required for a dual damascene process. However, the etch stop layer 165 may not be formed. Next, a trench-level IMD 170 is formed on the etch stop layer 165. Like the via-level IMD 150, the trench-level IMD 170 is formed of black diamond, fluorine silicate glass (FSG), SiOC, polyimide, or SiLK™, which is a low-k dielectric material for reducing RC delay. Although the trench-level IMD 170 may be formed to a thickness of about 4000 Å to 7000 Å, preferably, 5500 Å, it is possible to adjust the thickness according to the positions where the trench-level IMD 170 is formed.

Figure 9:
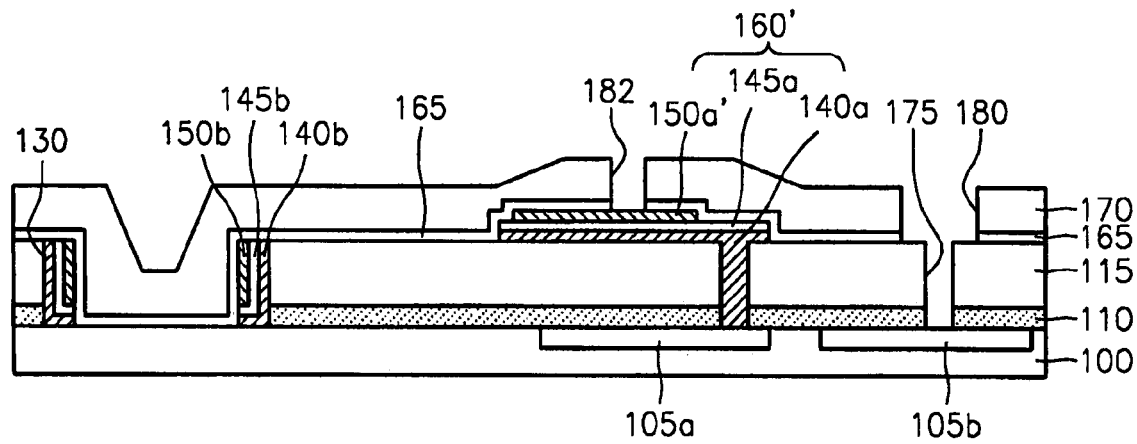

Referring to FIG. 9, the via-level IMD 115 and the trench-level IMD 170 are etched using a typical copper dual damascene process, thereby forming a via hole 175 for a dual damascene interconnection and a line trench 180, which expose the second metal interconnection 105b. Here, the formation of the via hole 175 for the dual damascene interconnection may be followed by the formation of the line trench 180. While the line trench 180 is being formed, a trench 182 also is formed to expose the upper electrode 150a' of the MIM capacitor 160'. However, it is also possible that the formation of the line trench 180 be followed by the formation of the via hole 175 for the dual damascene interconnection.

Figure 10:
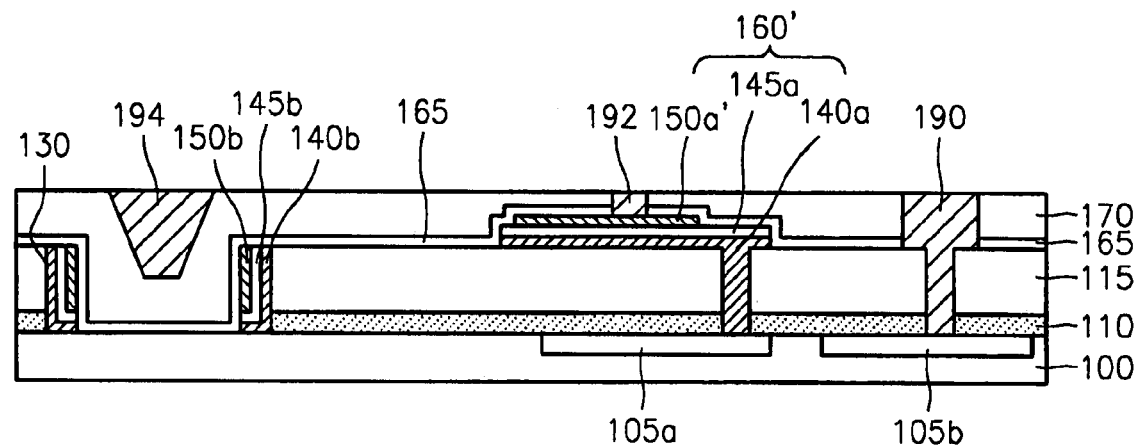

FIG. 10 shows a structure obtained by filling the stepped region of the alignment key 130, the trench 182, and the via hole 175 and the line trench 180 with copper and then carrying out a CVD process to the resultant structure shown in FIG. 9. In FIG. 10, reference numeral 190 denotes a copper dual damascene interconnection, 192 denotes an upper metal interconnection, and 194 denotes a dummy interconnection formed of copper filled in the stepped region of the alignment key 130.

The detailed process will be described hereinafter. A cleaning process is performed to the resultant structure where the via hole 175 for the dual damascene interconnection, the line trench 180, and the trench 182 are formed, and then a barrier metal layer (not shown) is formed thereon. The barrier metal layer is used to prevent diffusion of copper, which will be filled in the via hole 175 for the dual damascene interconnection, the line trench 180, and the trench 182, into adjacent regions. The barrier metal layer (not shown) can be formed to a thickness of about 200 Å to 1000 Å, preferably, 450 Å, and using one of Ti, Ta, W, TiN, TaN, and WN. Also, the barrier metal layer (not shown) can be deposited using CVD or sputtering. Next, the via hole 175 for the dual damascene interconnection, the line trench 180, and the trench 182 are filled with copper. Here, sputtering or CVD is typically used but it is also possible to use plating including electroplating and electroless plating. When the copper is filled using plating, a seed metal layer (not shown) is preferably formed first on the barrier metal layer. The seed metal layer improves the uniformity of the plated layer and functions as a region where the initial nuclei are grown. The seed metal layer may be formed to a thickness of about 500 Å to 2500 Å, preferably 1500 Å. While the seed metal layer may be typically formed using sputtering, it is possible to use a CVD method instead.

The sputtering is performed in conditions where, for example, a temperature of the substrate is 0° C., a sputter power is 2 kW, a pressure is 2 mTorr, and a distance between a target seed metal layer and the substrate is 60 mm. The seed metal layer is formed of Cu, Au, Ag, Pt, or Pd. A seed metal is selected according to the types of plated layer and the plating method. Since a plated copper layer contains minute grains and has a somewhat sparse structure, an annealing process is preferably performed to grow the grains through re-crystallization and thus reduce resistivity. Next, the top surface of the resultant structure is planarized using chemical mechanical polishing (CMP) until the top surface of the trench-level IMD 170 is exposed. Thus, a dual damascene interconnection 190, an upper metal interconnection 192, and a dummy interconnection 194 are formed.

As described above, after the via-level IMD 115 is formed, while the alignment key 130 is being formed to align the MIM capacitor 160', the lower electrode 140a of the MIM capacitor 160' is connected to the first lower metal interconnection 105a disposed under the via-level IMD 115. Also, the upper electrode 150a' of the MIM capacitor 160' is directly connected to the upper metal interconnection 192 during the copper dual damascene process. This enables the fabrication of a copper interconnection having the reliable MIM capacitor 160' without any additional photolithography process. Further, damage to vias can be prevented during patterning of the MIM capacitor 160', and the copper dual damascene process needs no modifications.

As shown in FIG. 10, the dual damascene interconnection with the MIM capacitor 160' according to the present invention comprises the via-level IMD 115 and the trench-level IMD 170, which are sequentially stacked on the substrate, the dual damascene interconnection 190 formed in the IMDs 115 and 170, and the MIM capacitor 160', which is formed between the via-level IMD 115 and the trench-level IMD 170 and includes the lower electrode 140a, the dielectric layer 145a, and the upper electrode 150a'.

The structure shown in FIG. 10 has the following characteristics. First, the MIM capacitor 160' is formed on the structure where the via-level IMD 115 is formed. In particular, the lower electrode 140a directly contacts the first lower metal interconnection 105a. That is, the lower electrode 140a and a via are integrally formed. Second, the alignment key 130 for aligning the MIM capacitor 160 is further included inside the via-level IMD 115, and the metal layer 140b for the lower electrode, the dielectric layer 145b, and the metal layer 150b for the upper electrode may be further included in the inner walls of the alignment key 130, and the dummy interconnection 194 may be further included on the alignment key 130. Third, the upper electrode 150a' can be directly connected to the upper metal interconnection 192 without vias.

In this structure, an ideal MIM capacitor can be formed without modifying a dual damascene process. Also, like the trench used for forming the upper metal interconnection connected to the upper electrode, the line trench used for forming the copper dual damascene interconnection also is formed by etching the trench-level IMD 170 and the etch stop layer 165. Further, since vias are not damaged during the formation of the MIM capacitor, the copper dual damascene process can be stably carried out.

Embodiment 2

Figure 11:
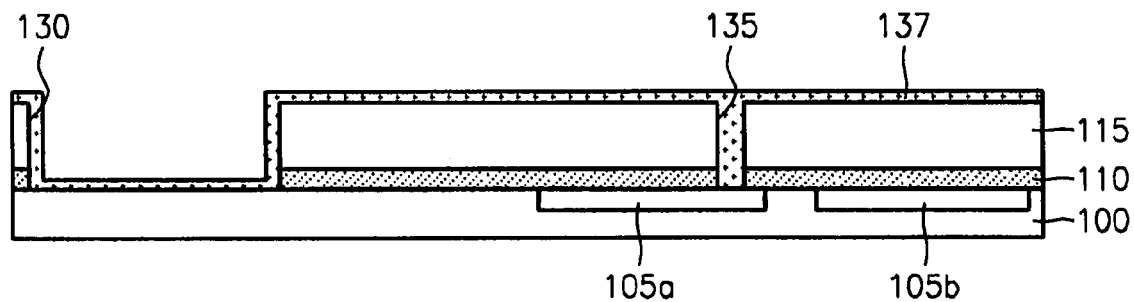
FIGS. 11 through 13 are cross-sectional views illustrating a method of fabricating a dual damascene interconnection with an MIM capacitor according to another embodiment of the present invention.
Figure 12:
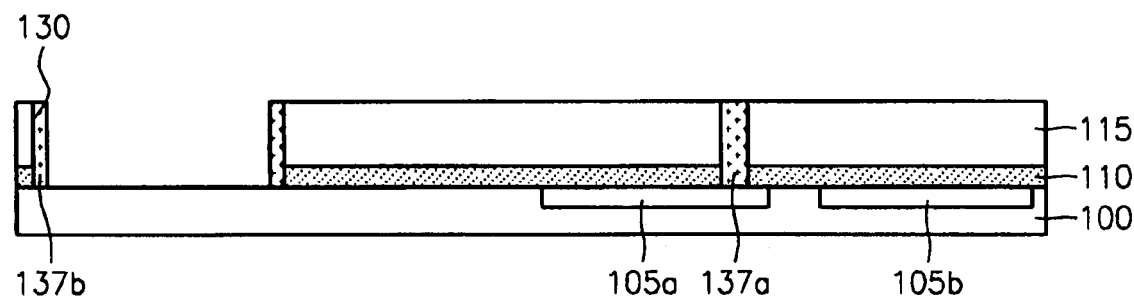
Figure 13:
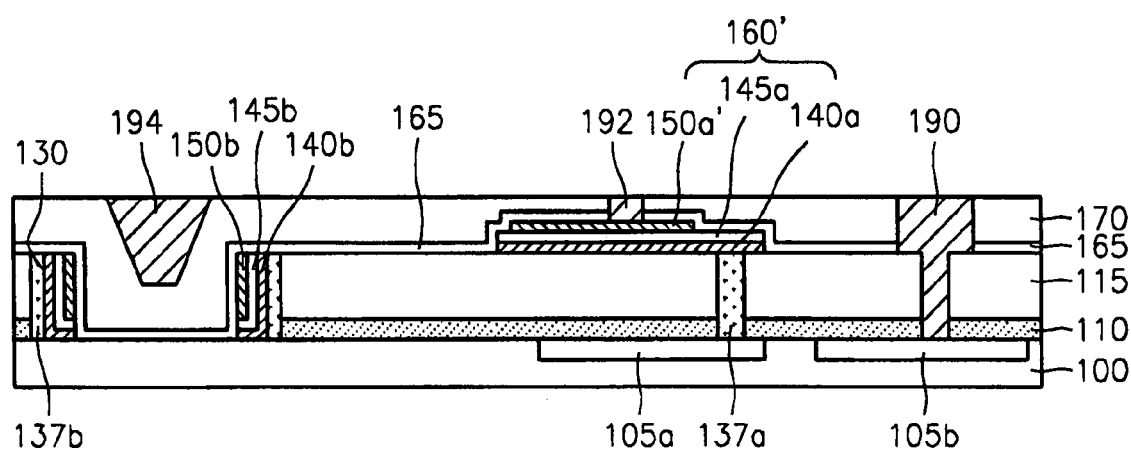

FIGS. 11 through 13 are cross-sectional views illustrating a method of fabricating a dual damascene interconnection with an MIM capacitor according to another embodiment of the present invention. The present embodiment is a modified version of the first embodiment.

To begin, the process steps as described with reference to FIGS. 4 and 5 are performed. Next, as shown in FIG. 11, a metal layer 137 is deposited on the entire surface of a via-level IMD 115 using CVD so as to completely fill a via hole 135.

Then, as shown in FIG. 12, an etchback process or a CMP process is carried out, thereby completing a via 137a connected to a first lower metal interconnection 105a. A metal layer 137b may remain on the inner walls of an alignment key 130 as shown in FIG. 12. However, since the remaining metal layer 137b is not connected to any interconnection, it may or may not be removed. Next, a metal layer for a lower electrode, a capacitor dielectric layer, and a metal layer for an upper electrode are sequentially stacked and patterned, thereby forming an MIM capacitor 160', which includes a lower electrode 140a connected to the via 137a, a dielectric layer 145a, and an upper electrode 150a'. As described above, in the present embodiment, the MIM capacitor 160' is formed on the via 137a formed by an additional process. Subsequent processes are performed as described with reference to FIGS. 8 through 10. As a result, the resultant structure shown in FIG. 13 is obtained.

Embodiment 3

Figure 14:
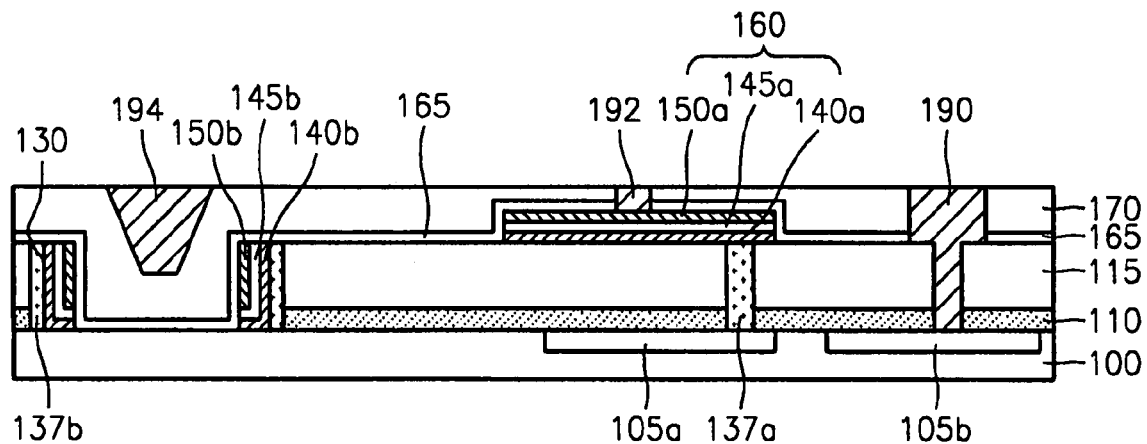
FIGS. 14 through 16 are cross-sectional views of a dual damascene interconnection with an MIM capacitor according to yet another embodiment of the present invention.
Figure 15:
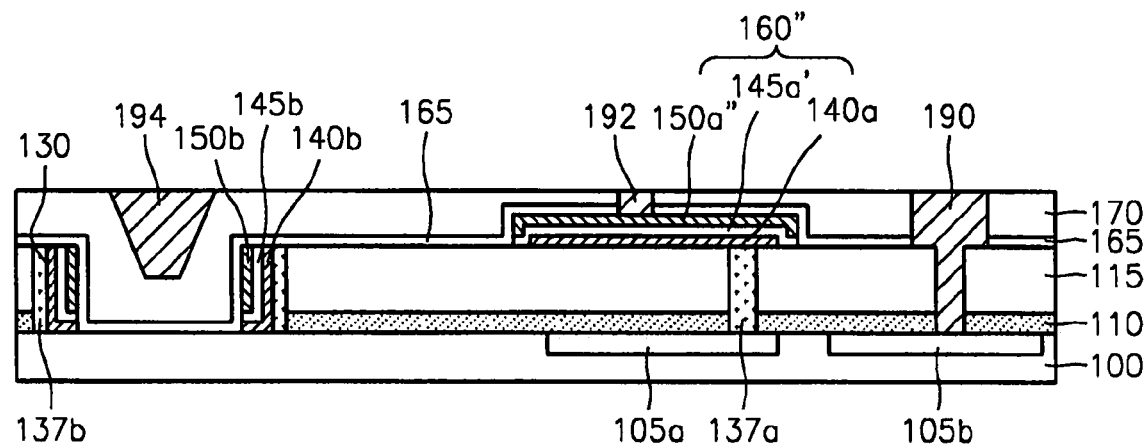
Figure 16:
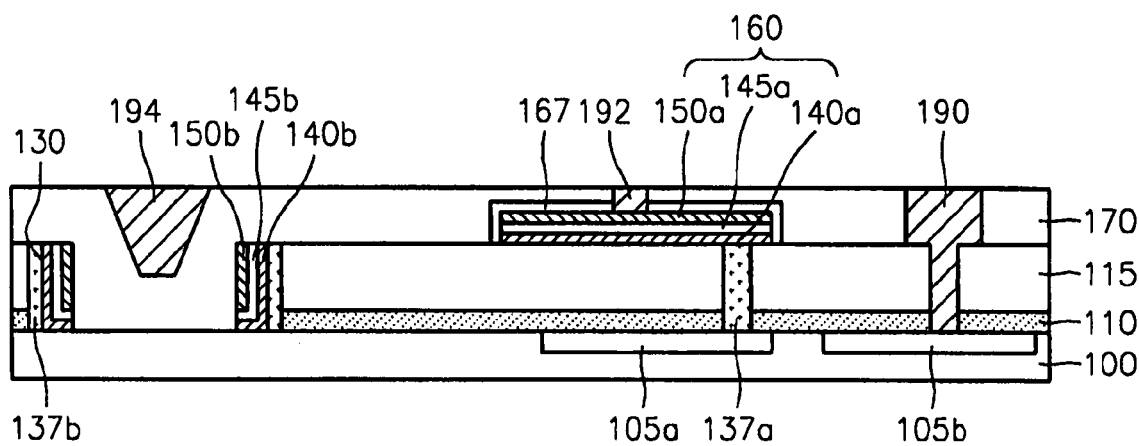

FIGS. 14 through 16 are cross-sectional views of a dual damascene interconnection with an MIM capacitor according to yet another embodiment of the present invention. In the present embodiment, various modified examples of electrodes of the MIM capacitor will be described. Structures shown in FIGS. 14 through 16 are obtained based on the second embodiment. However, they may be identically obtained based on the first embodiment or any other methods.

Referring to FIG. 14, a patterning process is performed using a metal layer 140 for a lower electrode, a capacitor dielectric layer 145, and a metal layer 150 for an upper electrode as a mask, thereby forming an MIM capacitor 160, which includes a lower electrode 140a, a dielectric layer 145a, and an upper electrode 150a, which have the same area. The structure shown in FIG. 14 is obtained without etching edges of the upper electrode 150a. Thus, unlike other structures, one mask can be saved.

By comparison, referring to FIG. 15, a metal layer for a lower electrode is first formed and patterned to form a lower electrode 140a, and a dielectric layer 145 and a metal layer 150 for an upper electrode are stacked on the lower electrode 140a and then patterned. Thus, an MIM capacitor 160", which includes the lower electrode 140a, a dielectric layer 145a', and an upper electrode 150a", is formed.

Also, referring to FIG. 16, an etch stop layer is not formed on an MIM capacitor 160 on the entire surface of a via-level IMD 115. That is, a diffusion barrier layer 167 is formed to cover only the MIM capacitor 160. Like the example shown in FIG. 14, since etching edges of an upper electrode 150a is not required, one mask can be saved.

Embodiment 4

Figure 17:
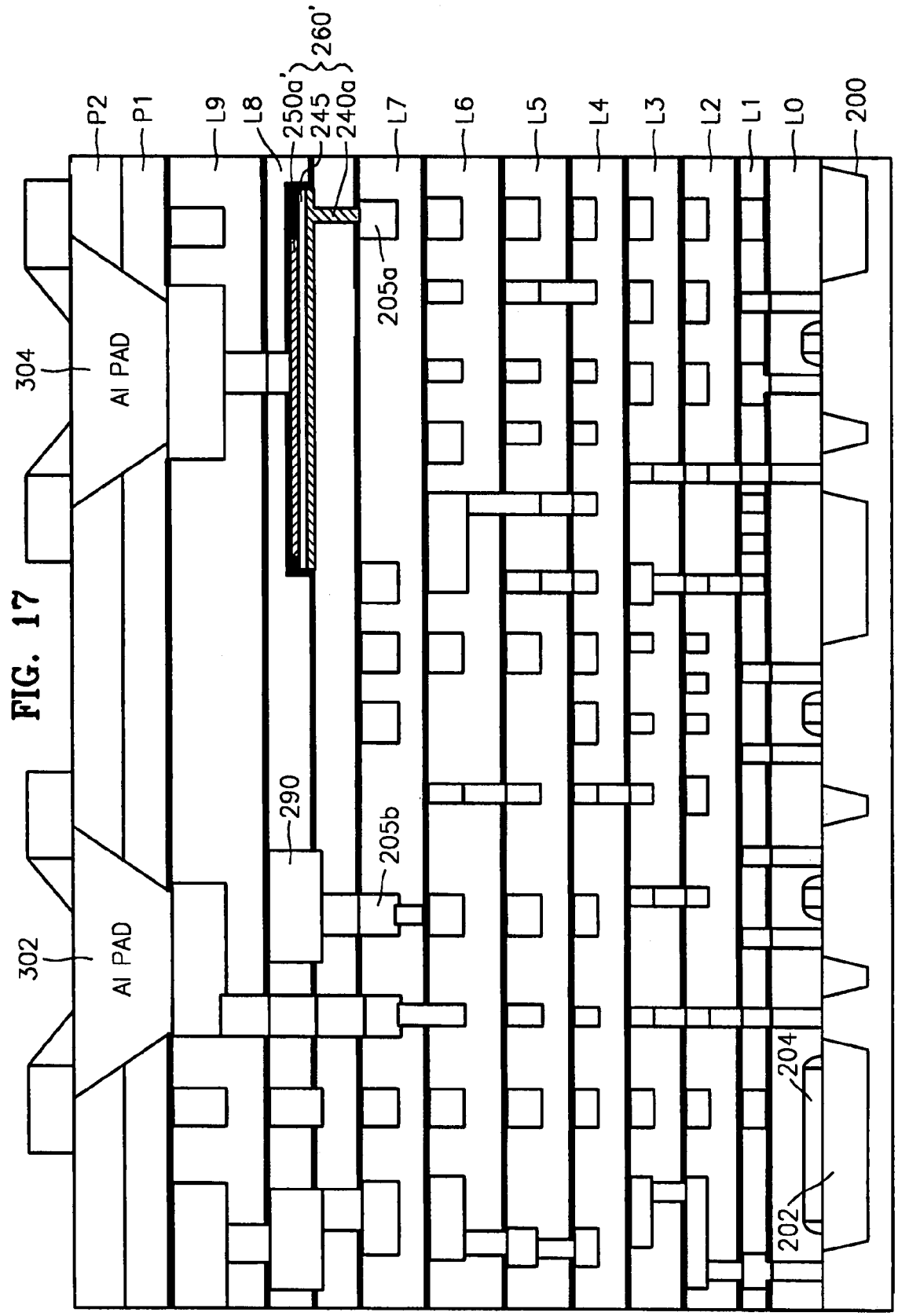
FIG. 17 is a cross-sectional view of a dual damascene interconnection with an MIM capacitor according to another embodiment of the present invention.

FIG. 17 is a cross-sectional view of a dual damascene interconnection with an MIM capacitor according to another embodiment of the present invention.

Referring to FIG. 17, a device isolation layer (e.g., an STI) 202 is formed on a substrate 200, and a gate electrode 204 is formed thereon. Interlayer dielectrics (ILDs) L0, L1, . . . , and L7 and IMDs L8 and L9, which include a variety of interconnections, are formed on the basic structure. The ILD L0 is formed to a thickness of about 2000 Å to 5000 Å, and each of the ILDs L1, L2, . . . , and L7 is formed to a thickness of about 6000 Å to 10000 Å. Also, each of the IMDs L8 and L9 is formed to a thickness of about 8000 Å to 15000 Å.

A first lower metal interconnection 205a formed in the ILD L7 is connected to a lower electrode 240a, which is integrally formed with a via on the IMD L8. The lower electrode 240a, a dielectric layer 245, and an upper electrode 250a' constitute an MIM capacitor 260'. Also, a second lower metal interconnection 205b formed in the ILD L7 is connected to a dual damascene interconnection 290 formed in the IMD L8. Each of the lower electrode 240a, the dielectric layer 245, and the upper electrode 250a' may be formed to a thickness of about 300 Å to 1000 Å.

Two passivation layers P1 and P2 are formed on the IMD L9 where final metal interconnections are formed, and Al pads 302 and 304 are formed on the resultant structure to connect the metal interconnections to external terminals.

As described above, in the present invention, an MIM capacitor is formed on a via-level IMD, and a lower electrode of the MIM capacitor is connected to a lower metal interconnection by a photolithography process using an alignment key for aligning the MIM capacitor. Thus, the MIM capacitor can be formed without modifying a dual damascene process and using additional photolithography processes. Consequently, an ideal MIM capacitor can be fabricated and a copper dual damascene process can be reliably carried out.

While the present invention has been particularly shown and described with reference to a preferred embodiment thereof, it will be understood by those of ordinary skill in the art that various changes in form and details may be made therein without departing from the spirit and scope of the present invention as defined by the appended claims.

What is claimed is:

1. A method of fabricating a dual damascene interconnection with a metal-insulator-metal capacitor, the method comprising:

forming a via-level intermetal dielectric on a substrate where first and second lower metal interconnections are formed;

forming a via hole for connecting a lower electrode of a metal-insulator-metal capacitor and the first lower metal interconnection by patterning the via-level intermetal dielectric;

sequentially forming a metal layer for a capacitor lower electrode, a capacitor dielectric layer, and a metal layer for a capacitor upper electrode on the entire surface of the substrate;

forming the metal-insulator-metal capacitor, which includes a lower electrode, a dielectric layer, and an upper electrode, by patterning the metal layer for the lower electrode, the capacitor dielectric layer, and the metal layer for the upper electrode, which are disposed over the via hole;

forming a trench-level intermetal dielectric on the via-level intermetal dielectric including the metal-insulator-metal capacitor;

simultaneously forming a groove including a via hole and a line trench for a dual damascene interconnection, exposing the second lower metal interconnection, and a second trench exposing the upper electrode by etching the via-level intermetal dielectric and the trench-level intermetal dielectric; and forming a dual damascene interconnection connected to the second lower metal interconnection and an upper metal interconnection connected to the upper electrode by filling the groove for the dual damascene interconnection and the trench with a metal.

2. The method of claim 1, wherein the formation of the first lower metal interconnection and the second metal interconnection comprises:

forming an insulating layer on the substrate; and forming the first lower metal interconnection and the second lower metal interconnection by filling the insulating layer with a metal using a damascene process.

3. The method of claim 1, wherein the via hole is formed in a hole shape.

4. The method of claim 1, wherein the via hole is formed in a line shape.

5. The method of claim 1, further comprising:

forming an etch stop layer between the first and second lower metal interconnections and the via-level intermetal dielectric; and forming another etch stop layer between the via-level intermetal dielectric and the trench-level intermetal dielectric.

6. The method of claim 1, further comprising forming the metal-insulator-metal capacitor using one masking process and then reducing the area of the upper electrode by etching edges of the upper electrode.

7. The method of claim 1, wherein the lower electrode directly contacts the first lower metal interconnection by the via hole.

8. The method of claim 1, after forming the via hole, further comprising forming a via for connecting the lower electrode and the first lower metal interconnection by filling the via hole with a conductive material and then planarizing the filled conductive material.

9. The method of claim 1, wherein the formation of the groove for the dual damascene interconnection includes forming the via hole and the line trench using a via-first dual damascene process.

10. The method of claim 9, wherein, while the line trench is being formed, the second trench exposing the upper electrode is formed.

11. The method of claim 1, wherein the formation of the groove for the dual damascene interconnection includes forming the via hole and the line trench using a line trench-first dual damascene process.

12. The method of claim 1, wherein the dual damascene interconnection is formed of at least one material selected from the group consisting of copper, gold, silver, tungsten, and any alloy thereof.

13. The method of claim 1, wherein, while the via hole for connecting the lower electrode of the metal-insulator-metal capacitor and the first lower metal interconnection is being formed, an alignment key for aligning the metal-insulator-metal capacitor is formed by patterning the via-level intermetal dielectric.

14. The method of claim 13, wherein the formation of the metal-insulator-metal capacitor includes leaving the metal layer for the lower electrode, the capacitor dielectric layer, and the metal layer for the upper electrode on the inner walls of the alignment key by performing an anisotropic etchback process.

15. The method of claim 13, wherein, while the dual damascene interconnection and the upper metal interconnection are being formed, a dummy interconnection is formed by filling a stepped region of the alignment key.

* * * * *